United States Patent
Taya

(10) Patent No.: US 8,667,353 B2
(45) Date of Patent: Mar. 4, 2014

(54) SEMICONDUCTOR CHIP AND TEST METHOD

(75) Inventor: Takashi Taya, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 13/474,675

(22) Filed: May 17, 2012

(65) Prior Publication Data

US 2012/0297263 A1  Nov. 22, 2012

(30) Foreign Application Priority Data

May 18, 2011 (JP) .................................. 2011-111329

(51) Int. Cl.
*G01R 31/3181* (2006.01)
*G01R 31/40* (2006.01)

(52) U.S. Cl.
USPC .......................................... 714/733; 714/745

(58) Field of Classification Search
None
See application file for complete search history.

(56) References Cited

U.S. PATENT DOCUMENTS

| | | | |
|---|---|---|---|
| 3,818,339 A * | 6/1974 | Black ........................ | 324/140 R |
| 5,036,479 A * | 7/1991 | Prednis et al. ............... | 702/121 |
| 6,268,774 B1 * | 7/2001 | Soumyanath ................ | 330/305 |
| 7,489,030 B2 * | 2/2009 | Shibata et al. ............... | 257/686 |
| 2006/0066394 A1 * | 3/2006 | Eckl et al. ..................... | 330/2 |
| 2006/0214724 A1 * | 9/2006 | Ogawa et al. ................. | 327/538 |
| 2011/0059704 A1 * | 3/2011 | Norimatsu et al. ........... | 455/110 |
| 2011/0234204 A1 * | 9/2011 | Tamura ..................... | 324/123 R |
| 2011/0237199 A1 * | 9/2011 | Venkataraman et al. .. | 455/67.11 |

FOREIGN PATENT DOCUMENTS

JP        2008-228038 A      9/2008

* cited by examiner

*Primary Examiner* — Ajay Bhatia
*Assistant Examiner* — Dipakkumar Gandhi
(74) *Attorney, Agent, or Firm* — Rabin & Berdo, P.C.

(57) ABSTRACT

A semiconductor chip having a functional block that performs a communication function includes an input circuit that supplies an oscillating test signal to the functional block, and a test circuit that detects the strength of an oscillating signal which the functional block outputs in response. A strength signal indicating the detected strength is output from the test circuit through an external terminal of the semiconductor chip to a test device. The test device evaluates the strength signal to decide whether an operating characteristic of the functional block is within a specified range. The strength information indicated by the strength signal is not affected by impedance on the signal transmission line between the semiconductor chip and the test device, so the test is not affected by impedance loss.

20 Claims, 10 Drawing Sheets

15, 403

15, 403

SEMICONDUCTOR CHIP AND TEST METHOD

BACKGROUND OF THE INVENTION

1. Field of the Invention

The present invention relates to a semiconductor chip including communication circuitry, and to methods of testing the semiconductor chip.

2. Description of the Related Art

Wireless communication devices must put out radio-frequency (RF) signals at a level high enough to assure an adequate transmission distance, but not so high as to interfere with other wireless communications or violate radio regulations. Semiconductor integrated circuit chips that include wireless communication circuitry are therefore tested before shipment to make sure that their RF signal levels are within designated ranges. Test equipment for carrying out these tests (such as the equipment shown in FIG. 16 in Japanese Patent Application Publication No. 2008-228038, for example) typically includes a pair of test devices that are externally connected to the chip under test. The chip receives an RF test signal from one test device and outputs a corresponding RF signal to the other test device, which measures the level of the RF output signal. If the measured signal level falls within the designated range, the chip passes the test.

A problem with this conventional test scheme is when RF signals are transferred between the test devices and the chip under test they are affected by the impedances of the chip-to-device interconnections, causing a loss of signal power. This loss makes precise signal level measurement difficult and lowers the reliability of the test result.

Another problem is that accurate measurement of an RF signal level requires an expensive analyzer.

SUMMARY OF THE INVENTION

An object of the present invention is to test communication circuitry in a semiconductor chip accurately.

Another object is to reduce the cost of testing the semiconductor chip.

In a semiconductor chip including a functional block that generates an oscillating output signal to perform a communication function, the present invention provides an input circuit, a test circuit, and an external terminal. The input circuit supplies an oscillating test signal to the functional block. The functional block generates the oscillating output signal from the oscillating test signal. The test circuit detects the strength of the oscillating output signal and generates a strength signal indicating the detected strength. The strength signal is output from the external terminal.

The invention also provides a method of testing a semiconductor chip of this type by supplying the oscillating test signal to the functional block, detecting its strength with the on-chip test circuit, and outputting the strength signal from the semiconductor chip to a test device. The test device evaluates the strength signal to decide whether the functional block has an operating characteristic that falls within a specified range.

The test circuit may also be used to detect the strength of the oscillating test signal, and the test device may base its decision on the difference between the strength of the oscillating test signal and the strength of the oscillating signal output by the functional block.

The strength signal is preferably a type of signal that is not affected by impedance in the interconnection between the semiconductor chip and the test device. Accordingly, the test result is not affected by such impedance, and the functional block can be tested accurately.

The test cost is reduced because measurement of the strength signal does not require an expensive analyzer.

The term 'oscillating signal' is used herein to denote any signal having an oscillating waveform, possibly modulated in some way, that is used for communication purposes. In particular, the term includes the radio-frequency signals and intermediate-frequency signals used in wireless communication.

DETAILED DESCRIPTION OF THE INVENTION

Figure 1:
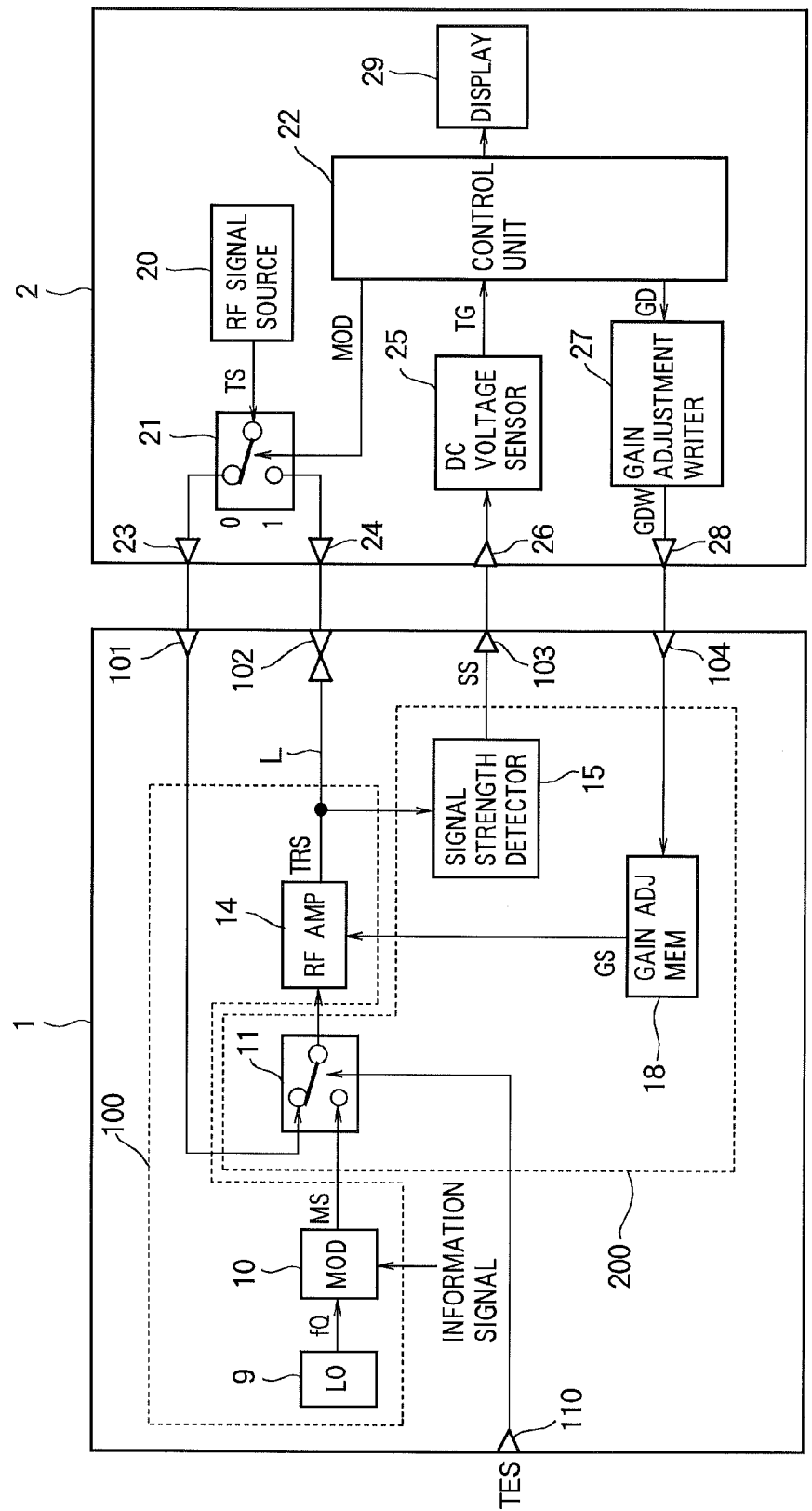
FIG. 1 is a block diagram illustrating the structure of an exemplary semiconductor chip test system according to the present invention.

Embodiments of the invention will now be described with reference to the attached drawings, in which like elements are indicated by like reference characters.

The embodiments concern a semiconductor chip having a plurality of functional blocks with communication functions. The semiconductor chip also includes input circuitry for supplying an oscillating test signal to test one or more of the functional blocks, and at least one test circuit for detecting the strength of an oscillating output signal generated by the functional block under test.

Referring to FIG. 1, the semiconductor chip 1 is connected to a test device 2. The semiconductor chip 1 includes various wireless communication circuitry and test support circuitry. FIG. 1 shows only two parts of this circuitry: a transmitting section 100 that performs transmission operations in the wireless communication circuitry, and a test support circuit 200 that is used to test and adjust an amplifier in the transmitting section 100.

The transmitting section 100 includes a local oscillator (LO) 9, a modulator (MOD) 10, and an RF amplifier (RF AMP) 14. The test support circuit 200 includes an input switch 11, a signal strength detector 15, and a gain adjustment memory (GAIN ADJ MEM) 18. The semiconductor chip 1 has external terminals 101, 102, 103, 104, and 110.

The local oscillator 9 in the transmitting section 100 generates a local oscillator signal fQ, which it supplies to the modulator 10. The modulator 10 modulates the local oscillator signal fQ by means of an information signal including information to be transmitted and supplies the resultant modulated signal MS to the input switch 11. The local oscillator signal fQ and modulated signal MS are both radio-frequency oscillating signals.

The input switch 11 is controlled by a test command signal TES received from the test device or another external source (not shown) at terminal 110. When the test command signal TES is at the '0' logic level, the input switch 11 supplies the RF amplifier 14 with the modulated signal MS from the modulator 10. When the TES signal is at the '1' logic level, the input switch 11 supplies the RF amplifier 14 with an oscillating test signal received at terminal 101. This oscillating test signal is also a radio-frequency signal and will be referred to below as the RF test signal TS. The test command signal TES is externally held at the '1' logic level when the semiconductor chip 1 is being tested, and at the '0' logic level during normal operation.

The RF amplifier 14 amplifies the signal MS or TS supplied from the input switch 11 to generate a transmit signal TRS, which is also a radio-frequency oscillating signal. The gain of the RF amplifier 14 is controllable by a gain signal GS. The RF amplifier 14 outputs the transmit signal TRS via a signal line L to terminal 102, and to the signal strength detector 15 in the test support circuit 200. Terminal 102 is normally connected to a wireless antenna (not shown), from which the transmit signal TRS is transmitted as a wireless signal.

During testing of the semiconductor chip 1, however, terminal 102 is connected to the test device 2 and functions as an input terminal that receives the RF test signal TS. The signal strength detector 15 detects the strength of either the transmit signal TRS output to terminal 102 or the RF test signal TS input from terminal 102, and outputs a strength signal SS indicating the detected strength to terminal 103. Use of the same terminal 102 both for output of the transmit signal TRS to an antenna during normal operation and input of the RF test signal TS to the signal strength detector 15 during a test reduces the number of external terminals that must be provided in the semiconductor chip 1.

Figure 2:
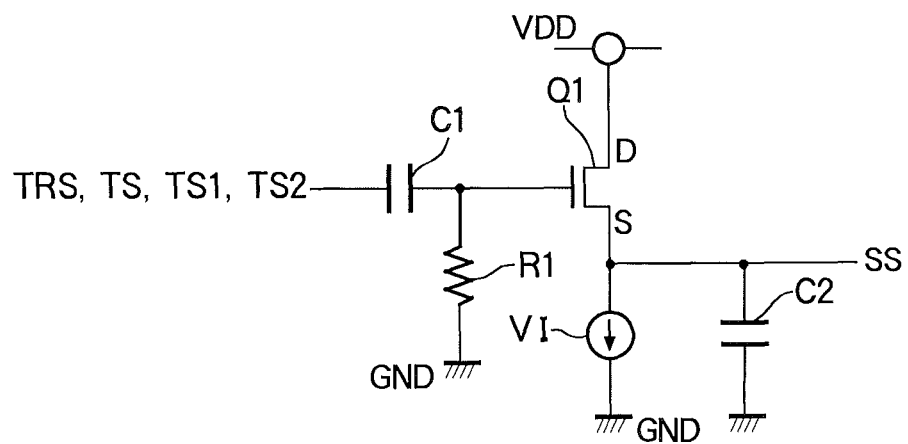
FIGS. 2 and 3 are circuit diagrams illustrating two exemplary internal structures of the signal strength detectors in FIGS. 1, 5, 7, and 9.
Figure 3:
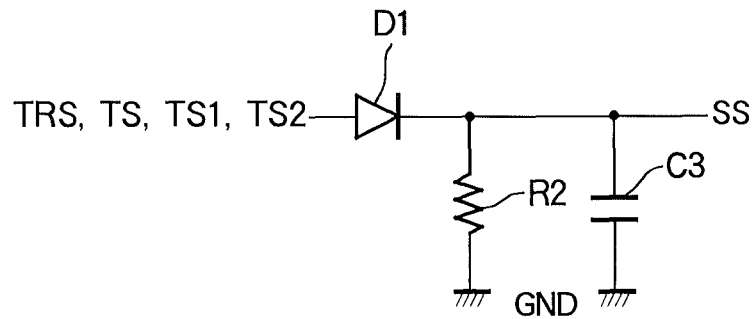

FIGS. 2 and 3 show exemplary circuit configurations of the signal strength detector 15. In the configuration in FIG. 2, the RF test signal TS or transmit signal TRS is coupled as an input signal to the gate terminal of a metal oxide semiconductor field effect transistor (MOSFET) Q1 via a capacitor C1. The gate terminal of the transistor Q1 is connected to one terminal of a resistor R1, the other terminal of which is grounded. A power supply voltage VDD is applied to the drain terminal of the transistor Q1, and a current source VI is connected to its source terminal. The source terminal of the transistor Q1 is also connected to one terminal of a capacitor C2, the other terminal of which is grounded.

The circuit in FIG. 2 has a FET source follower configuration and operates as a half-wave rectifier. By rectifying the input signal TS or TRS, it generates a direct-current (DC) voltage corresponding to the peak or envelope level of the input signal TS or TRS. This DC voltage is output from the source terminal of the transistor Q1 as the strength signal SS.

In the circuit shown in FIG. 3, the input signal TS or TRS is supplied to the anode of a diode D1. The cathode of the diode D1 is connected to respective terminals of a resistor R2 and a capacitor C3, the other terminals of which are grounded. Operating as a diode half-wave rectifier, this circuit generates a DC voltage corresponding to the peak or envelope level of the input signal TS or TRS. The generated DC voltage is output from the cathode terminal of the diode D1 as the strength signal SS.

The further input signals TS1, TS2 indicated in FIGS. 2 and 3 concern other embodiments, shown later.

Referring again to FIG. 1, the gain adjustment memory 18 in the test support circuit 200 stores gain write data GDW received via terminal 104 and generates the gain signal GS that controls the gain of the RF amplifier 14. The gain signal GS has a level corresponding to the value of the gain write data GDW.

During normal operation of the semiconductor chip 1, terminals 101, 103, and 104 are left externally disconnected and are not used.

The test device 2 in FIG. 1 includes an RF signal source 20, an input switch 21, a control unit 22, a DC voltage sensor 25, a gain adjustment writer 27, and a display 29. The test device 2 also has external output terminals 23, 24, 28 and an external input terminal 26.

The RF signal source 20 generates the RF test signal TS and supplies it to the input switch 21. The RF test signal TS has the nominal frequency specified for the local oscillator signal fQ.

The input switch 21 is controlled by a test mode signal MOD output from the control unit 22. The input switch 21 routes the RF test signal TS to output terminal 23 when the test mode signal MOD is at the '0' logic level, and to output terminal 24 when the test mode signal MOD at the '1' logic level. Terminal 23 is connected to terminal 101 of the semiconductor chip 1. Terminal 24 is connected to terminal 102 of the semiconductor chip 1.

The input terminal 26 of the test device 2 is connected to terminal 103 of the semiconductor chip 1 and receives the strength signal SS. The DC voltage sensor 25 measures the DC voltage of the strength signal SS and supplies the control unit 22 with the measured voltage value in digital form as a strength value TG. The control unit 22 supplies gain data GD to the gain adjustment writer 27. The gain adjustment writer 27 generates gain write data GDW to be written in the gain adjustment memory 18 in the semiconductor chip 1, and outputs the GDW data via terminal 28, which is connected to input terminal 104 of the semiconductor chip 1.

The testing and adjustment of the RF amplifier 14 in the semiconductor chip 1 by the test device 2 in FIG. 1 will now be described.

To test and adjust the RF amplifier 14 in the semiconductor chip 1, first the test command signal TES supplied to terminal 110 of the semiconductor chip 1 is placed and held at the '1' logic level. This causes the signal input at terminal 101, instead of the modulated signal output from the modulator 10, to be supplied to the RF amplifier 14.

Figure 4:
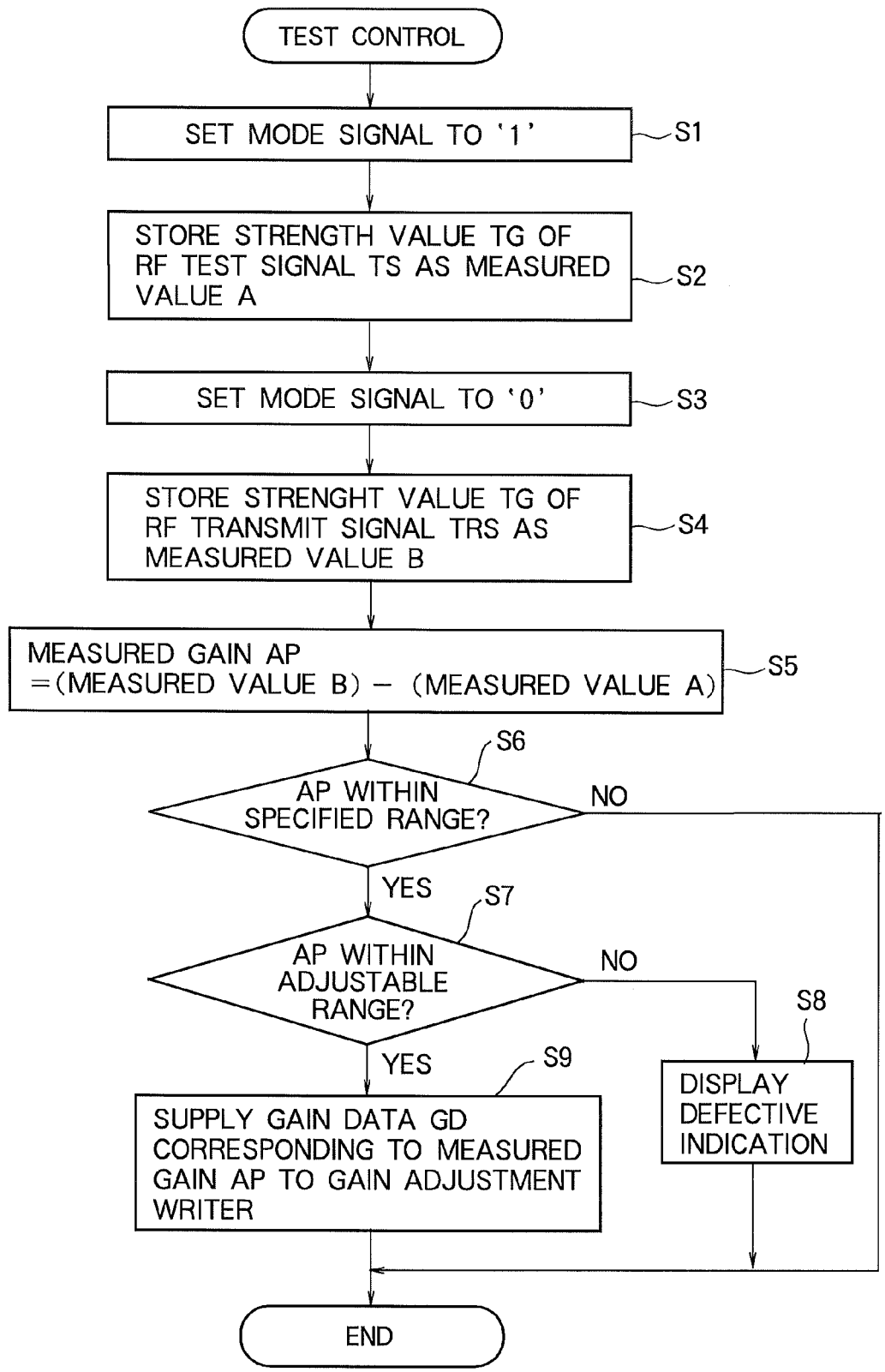
FIG. 4 is a flowchart illustrating an exemplary test control procedure carried out by the control unit in FIG. 1.

In this condition, the control unit 22 in the test device 2 carries out the test control procedure shown in FIG. 4.

Initially, the control unit 22 sets the test mode signal MOD that controls input switch 21 to the '1' logic level (step S1). Execution of step S1 causes input switch 21 to supply the RF test signal TS generated by the RF signal source 20 to terminal 24 and thus through terminal 102 of the semiconductor chip 1 to the signal strength detector 15, which detects the strength of the RF test signal TS. The strength signal SS indicating the detected signal strength is sent via terminals 103 and 26 to the DC voltage sensor 25 in the test device 2, which measures the DC voltage of the strength signal SS and outputs a strength value TG indicating the measured DC voltage value.

The control unit 22 receives the strength value TG from the DC voltage sensor 25 and stores it as a measured value A in an internal register (not shown) (step S2).

To summarize, in steps S1 and S2, the strength of the RF test signal TS sent from the test device 2 to semiconductor chip 1 is detected by the signal strength detector 15 in the semiconductor chip 1. The result is sent back to the test device 2, where it is stored in an internal register as measured value A.

Next, the control unit 22 sets the test mode signal MOD that controls input switch 21 to the '0' logic level (step S3). Execution of step S3 causes input switch 21 to supply the RF test signal TS to terminal 23 and thus to terminal 101 of the semiconductor chip 1. The input switch 11 in the semiconductor chip 1 then supplies the RF test signal TS to the RF amplifier 14. The RF amplifier 14 amplifies the RF test signal TS to generate an amplified transmit signal TRS. The signal strength detector 15 detects the strength of the transmit signal TRS and sends a DC voltage signal SS indicating the detected signal strength via terminals 103 and 26 to the DC voltage sensor 25 in the test device 2. The DC voltage sensor 25 measures the DC voltage of the strength signal SS and outputs a strength value TG indicating the measured DC voltage value.

The control unit 22 receives the strength value TG from the DC voltage sensor 25 and stores it in an internal register as a measured value B (step S4).

To summarize, in steps S3 and S4 the RF amplifier 14 receives the RF test signal TS from the test device 2 via terminal 101 and amplifies it to generate a transmit signal TRS. The signal strength detector 15 detects the strength of the transmit signal TRS and the result is stored in another internal register in the test device 2 as measured value B.

Next, the control unit 22 subtracts measured value A from measured value B to obtain the difference in strength between the RF test signal TS supplied to the semiconductor chip 1 and the amplified transmit signal TRS output by the RF amplifier 14, and stores the result in an internal register as the measured amplification factor or gain value AP of the RF amplifier 14 (step S5).

Then the control unit 22 decides whether the measured gain value AP falls within a specified range (step S6). If the measured gain value AP does not fall within the specified range in step S6, the control unit 22 decides whether it falls within an adjustable range (step S7). If the measured gain value AP does not fall within the adjustable range in step S7, the control unit 22 causes the display 29 in the test device 2 to display a test result indicating that the semiconductor chip 1 is defective (step S8).

If the measured gain value AP falls within the adjustable range in step S7, the control unit 22 reads a gain adjustment value corresponding to the measured gain value AP from a memory (not shown) and supplies gain data GD indicating the gain adjustment value to the gain adjustment writer 27 (step S9). The memory stores, for example, a table of gain adjustment values corresponding to gain values outside the specified range. Gain values above the upper limit of the specified range may be associated in the table with negative gain adjustment values that become increasingly negative as the gain value increases, to reduce the gain by increasing amounts. Gain values below the lower limit of the specified range may be stored in association with positive gain adjustment values that become increasingly positive as the gain value decreases, to increase the gain by increasing amounts.

Following step S9, the gain adjustment writer 27 converts the gain adjustment value indicated by the gain data GD to the value to be written in the gain adjustment memory 18 and supplies this value as gain write data GDW to the gain adjustment memory 18 in the semiconductor chip 1 via terminals 104 and 28. The gain adjustment memory 18 stores the gain write data GDW and outputs a corresponding gain signal GS that adjusts the gain of the RF amplifier 14. For example, if the gain adjustment indicated by the gain signal GS is positive, the gain of the RF amplifier 14 is adjusted by adding the gain signal level to an initial gain value. If the gain adjustment indicated by the gain signal GS is negative, the gain of the RF amplifier 14 is adjusted by subtracting the gain signal level from the initial gain.

Following either this gain adjustment or execution of step S8, or following a decision in step S6 that the measured gain value AP falls within the specified range, the control unit 22 terminates the test and adjustment process in FIG. 4.

To summarize, if the measured gain of the RF amplifier 14 is not within the specified range, the RF amplifier 14 is adjusted, if possible, to operate at a gain within the specified range. If the measured gain value is so far outside the specified range that adjustment is not possible, a message indicating that the semiconductor chip 1 is defective is displayed.

As described above, when the semiconductor chip 1 in FIG. 1 receives a test command to test one of its functional blocks, it switches the input to the block to be tested (the RF amplifier 14) over to an externally supplied RF test signal. The on-chip signal strength detector 15 detects the strength of the RF test signal and the strength of the transmit signal TRS generated by the RF amplifier 14 by amplification of the RF test signal, and outputs strength signals SS at DC levels indicating these signal strengths. On the basis of the strength signals SS output from the semiconductor chip 1, the test device 2 decides whether the gain of the RF amplifier 14 is within the specified range (step S6), thereby determining whether the RF amplifier 14 is operating within specified limits.

In this test, the transmit signal TRS generated in the RF amplifier 14 is not transmitted to the test device 2, so there is no loss of signal level as would occur if this oscillating signal were to be sent from the semiconductor chip 1 to the test device 2 over a signal transmission line.

Therefore, compared with conventional test procedures in which a high-frequency signal is returned to the test device and analyzed by an analyzer in the test device to test the RF amplifier 14, the configuration shown in FIG. 1 provides a more precise test, because the test is not affected by transmission line loss. In addition, the cost of the test is reduced because the test does not require an expensive analyzer.

In the configuration in FIG. 1, an operating characteristic of the RF amplifier 14 is tested by using the on-chip signal strength detector 15 to measure both the strength of the input RF test signal TS (measured value A) and the strength of the amplified transmit signal TRS (measured value B), and subtracting measured value A from measured value B. The RF test signal TS is supplied from the test device 2 to the RF amplifier 14 over a first transmission line interconnecting terminals 23 and 101 to measure the strength of the transmit signal TRS, and over a second transmission line interconnecting terminals 24 and 102 to measure the strength of the RF test signal TS. Although transmission losses occur on the first and second transmission lines, the losses are substantially equal, so when measured value A is subtracted from measured value B, the losses substantially cancel out.

The loss of signal level that occurs when an RF signal is carried over a signal transmission line between terminals of the semiconductor chip 1 and test device 2 is thereby substantially eliminated from the test result, enabling higher precision test and adjustment.

Figure 5:
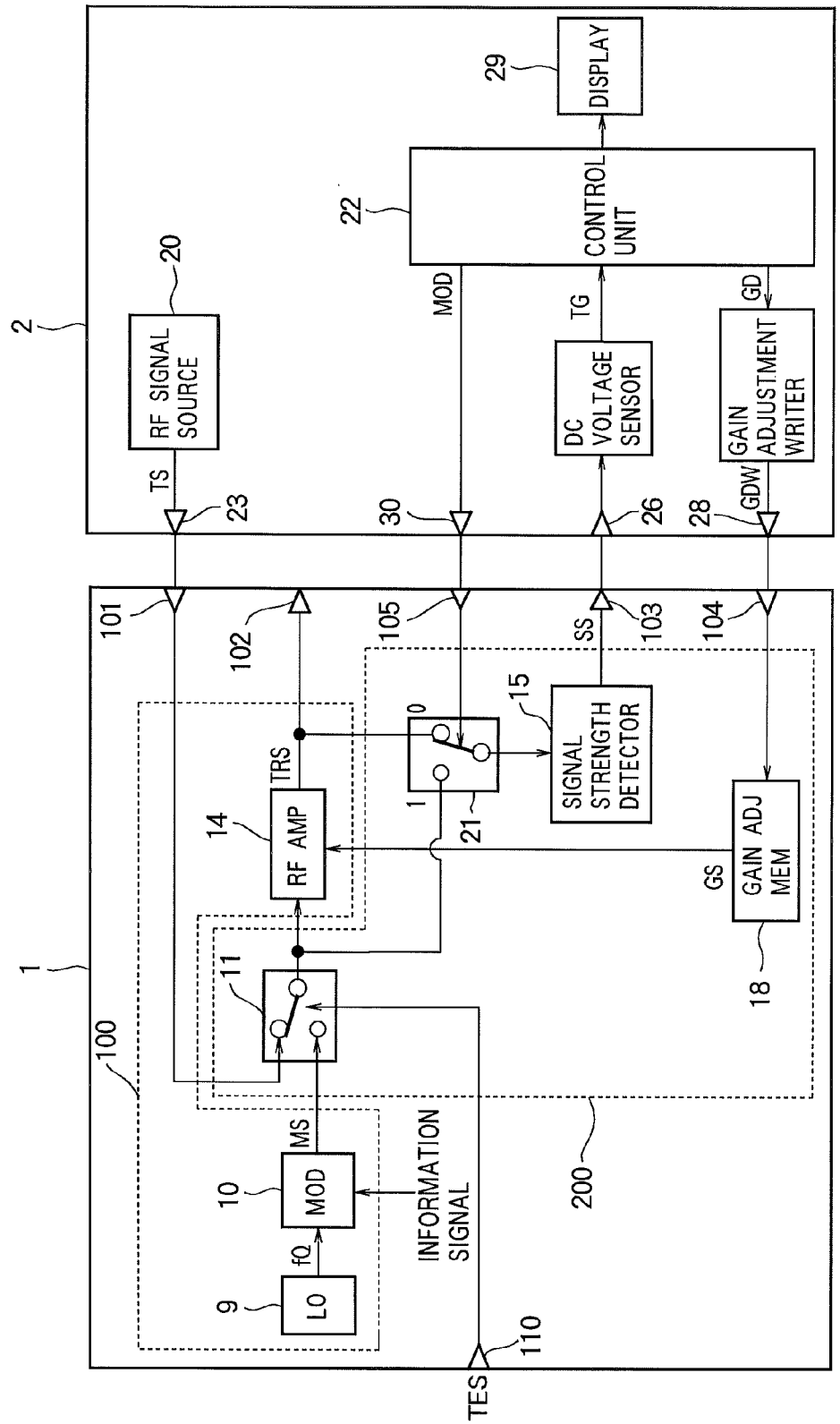
FIG. 5 is a block diagram showing a variation of the structure shown in FIG. 1.

The input switch 21 for switching the destination (the signal strength detector 15 or RF amplifier 14) of the RF test signal TS is located in the test device 2 in FIG. 1, but this switch 21 may be located in the test support circuit 200 in the semiconductor chip 1 instead, as shown in FIG. 5.

In the configuration in FIG. 5, the test mode signal MOD is transmitted from the control unit 22 via a terminal 30 to a terminal 105 of the semiconductor chip 1, to control the input switch 21 in the semiconductor chip 1. The RF test signal TS generated in the RF signal source 20 in the test device 2 is always sent from terminal 23 to terminal 101 of the semiconductor chip 1. Switch 11 in the semiconductor chip 1 supplies the RF test signal TS to both the RF amplifier 14 and input switch 21. When the test mode signal MOD is at the '1' logic level, input switch 21 passes the RF test signal TS to the signal strength detector 15; when the test mode signal MOD is at the '0' logic level, input switch 21 passes the amplified transmit signal TRS output by the RF amplifier 14 to the signal strength detector 15. This configuration has the advantage that the loss in transmission of the RF test signal TS from the test device 2 to the semiconductor chip 1 is exactly the same when the strength of the RF test signal TS is being measured as when the strength of the transmit signal TRS is being measured. The losses therefore cancel out precisely. The advantages of the configuration in FIG. 1 are that the semiconductor chip 1 requires one less external terminal and one less internal switch, and the strength of the RF test signal TS can be measured without the loss and delay due to passage through a longer interconnection path in the semiconductor chip 1 in FIG. 5.

The present invention also enables precise test and adjustment of semiconductor chips at the semiconductor wafer stage.

Figure 6:
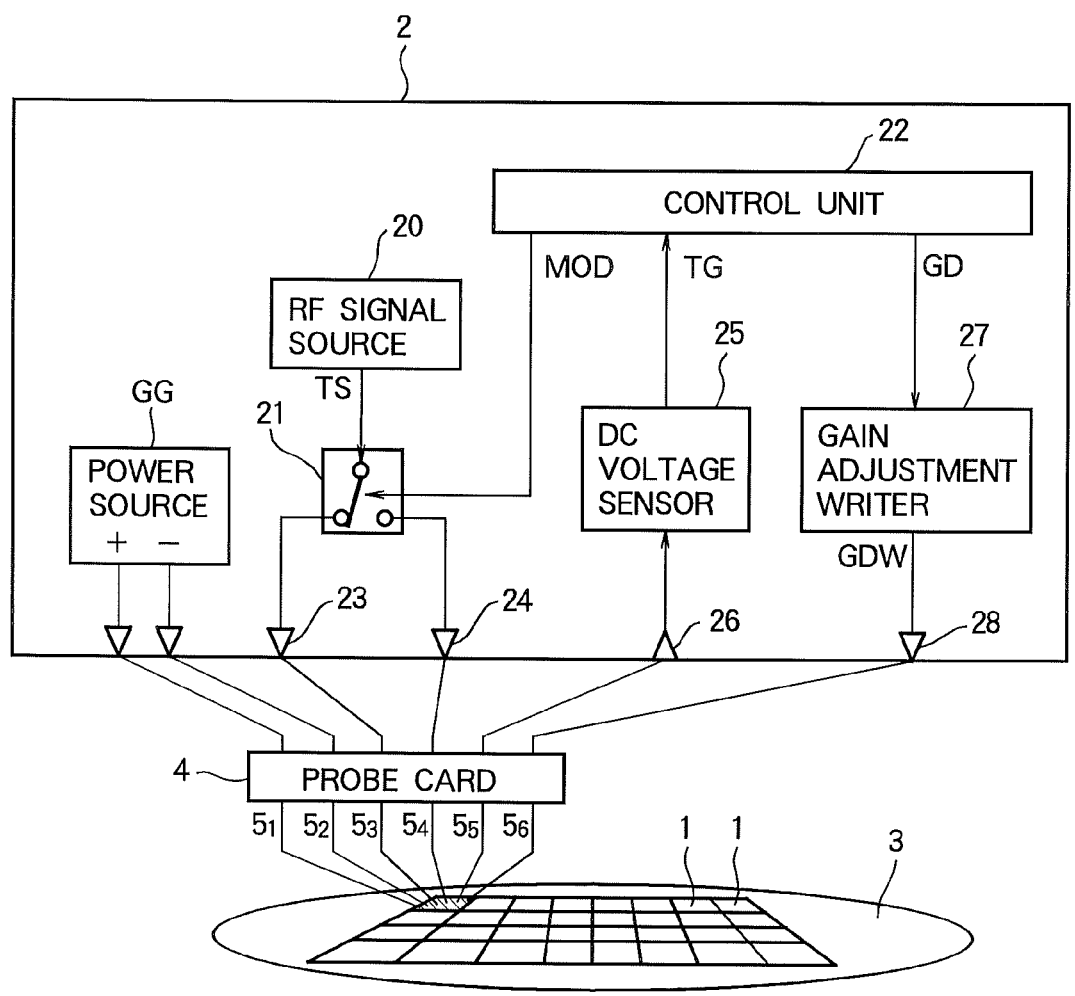
FIG. 6 illustrates the structure of an exemplary semiconductor chip test system for testing a plurality of semiconductor chips formed on a semiconductor wafer.

Referring to FIG. 6, the structure of a system for testing and adjusting a plurality of semiconductor chips 1 formed on a semiconductor wafer 3 will now be described. Each semiconductor chip 1 has the circuit configuration shown in FIG. 1.

The system in FIG. 6 includes a test device 2 and a probe card 4. The test device 2 includes the circuit blocks and terminals shown in FIG. 1 and a power source GG that supplies power to two power output terminals. The probe card 4 has six probes, $5_1$ to $5_6$. Probes $5_1$ and $5_2$ are connected by power and ground lines to the power output terminals of the test device 2. Probes $5_3$ to $5_6$ are connected to terminals 23, 24, 26, and 28, respectively. When a semiconductor chip 1 on the semiconductor wafer 3 is tested, probes $5_1$ to $5_6$ are placed in contact with the surfaces of respective pads in the semiconductor chip 1. Probes $5_1$ and $5_2$ make contact with a power pad and a ground pad, from which the power generated by the power source GG in the test device 2 is supplied to the circuits in the semiconductor chip 1. Probes $5_3$ to $5_6$ make contact with the surfaces of terminal pads 101 to 104 of the semiconductor chip 1.

Because the probes make direct contact with the terminals of the semiconductor chips 1 formed on the semiconductor wafer 3, the RF test signal TS passing through probes $5_3$ and $5_4$ is affected by an impedance having a resistive component due to contact resistance and an inductive component due to the comparatively long probe length, causing a loss of signal power.

This loss, however, does not affect the RF amplifier gain measurement, because the strengths of the RF test signal TS and transmit signal TRS are both detected by the signal strength detector 15 in the semiconductor chip 1 and converted to a DC signal SS indicating the detected strength. Although this signal SS is sent to the test device 2 via probe $5_5$, being a DC signal, its voltage level is not affected by the impedance of probe $5_5$. The test device 2 therefore receives accurate information about the detected RF signal levels.

As explained above, the test device 2 calculates the amplifier gain (AP) as the difference in strength between the RF signal before amplification (TS) and after amplification (TRS), causing the signal power losses in probes $5_3$ and $5_4$ to substantially cancel out. The amplifier gain can therefore be tested and adjusted with high precision.

Figure 9:
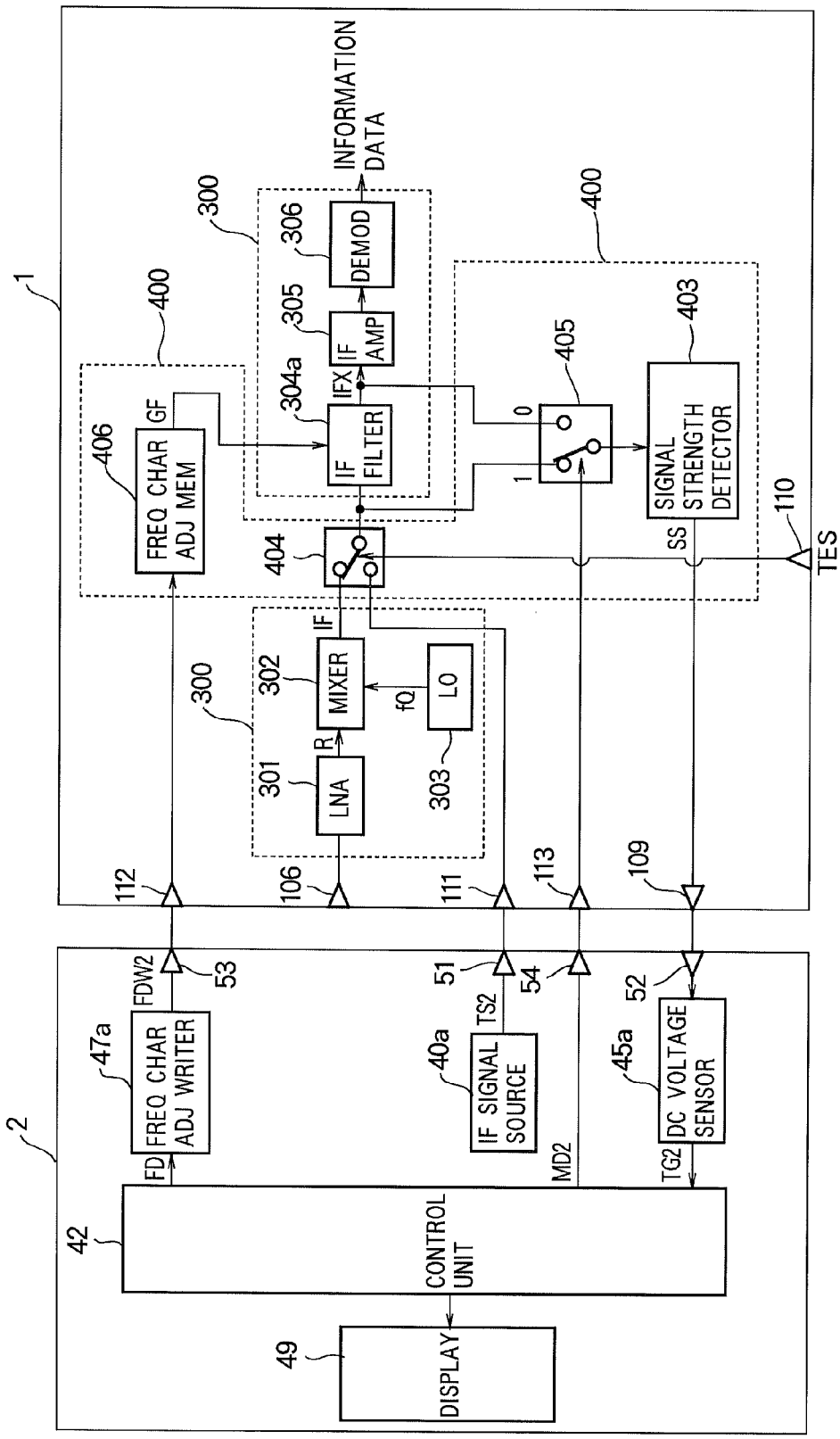
FIG. 9 is a block diagram illustrating the structure of yet another exemplary semiconductor chip test system.

Test and adjustment operations for the transmitting section 100 of the wireless communication circuitry in the semiconductor chip 1 have been described above. Similar tests and adjustments can also be carried out on the receiving section. Internal structures provided in the semiconductor chip 1 and test device 2 to test and adjust the receiving section of the semiconductor chip 1 are shown in FIGS. 7 and 9.

Figure 7:
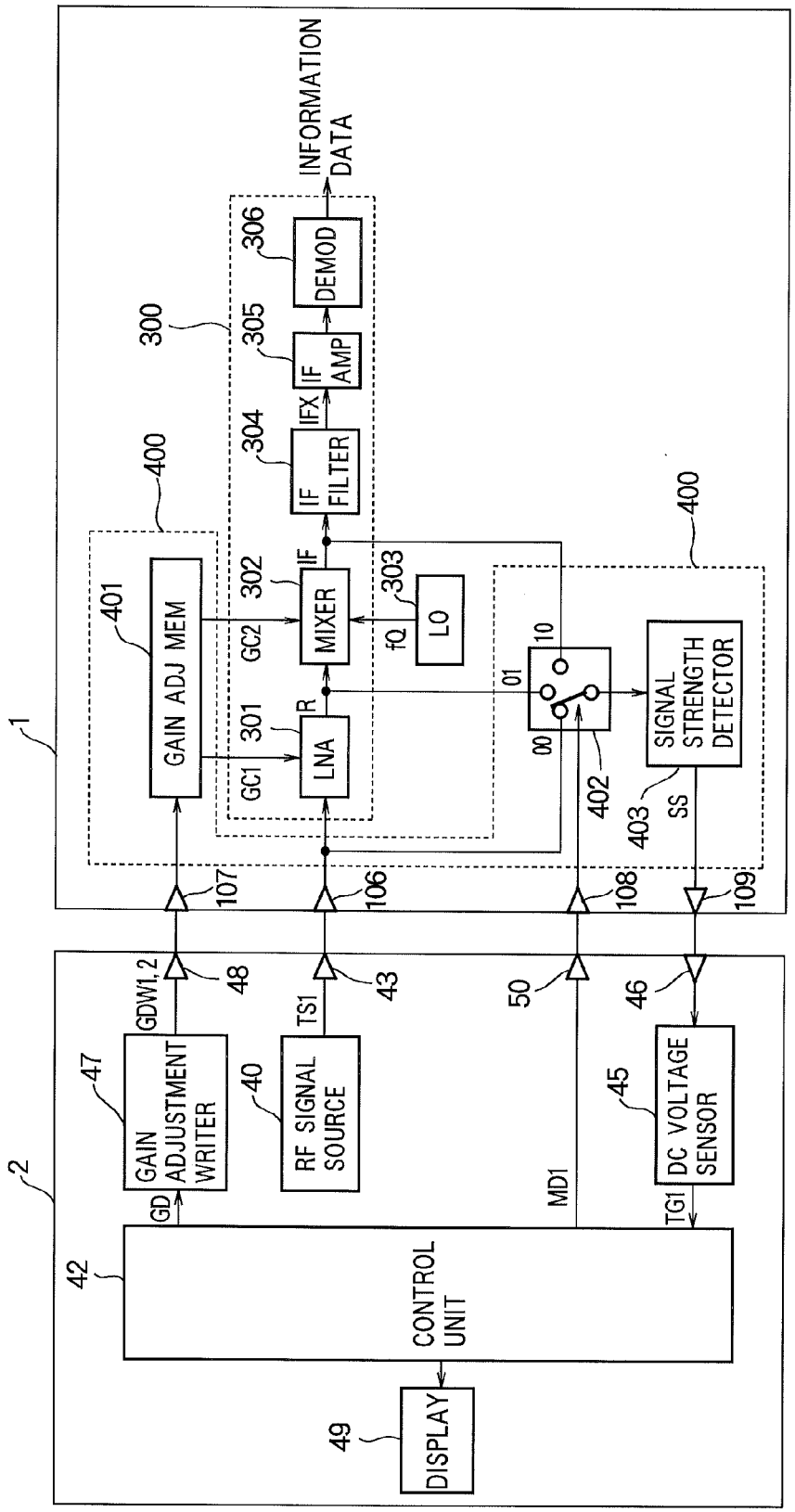
FIG. 7 is a block diagram illustrating the structure of another exemplary semiconductor chip test system.

Referring first to FIG. 7, the semiconductor chip 1 includes a receiving section 300 for performing wireless receiving operations, a test support circuit 400, and terminals 106, 107, 108, and 109. For simplicity, other circuits and terminals in the semiconductor chip 1 are not shown. The receiving section 300 includes a low-noise amplifier (LNA) 301, a mixer 302, a local oscillator (LO) 303, an intermediate-frequency (IF) filter 304, an intermediate-frequency amplifier (IF AMP) 305, and a demodulator (DEMOD) 306. The test support circuit 400 includes a gain adjustment memory 401, an input switch 402, and a signal strength detector 403. The test support circuit 400 is adapted to test and adjust the low-noise amplifier 301 and mixer 302 in the receiving section 300.

Operating with a gain controlled by a gain control signal GC1, the low-noise amplifier 301 amplifies the signal input at terminal 106. During normal operation of the semiconductor chip 1, terminal 106 is connected to a wireless transmitting and receiving antenna (not shown) and the low-noise amplifier 301 amplifies the RF signal received by the antenna. During test and adjustment operations, terminal 106 is connected to the test device 2 and the low-noise amplifier 301 amplifies an RF test signal TS1. The amplified signal is supplied as an amplified RF signal R to the mixer 302 and input switch 402.

The mixer 302 down-converts the amplified RF signal R to an intermediate frequency band by mixing it with a local oscillator signal fQ supplied from the local oscillator 303, then amplifies the down-converted signal with a gain controlled by a gain control signal GC2, and supplies the amplified signal as an intermediate-frequency signal IF to the intermediate-frequency filter 304 and input switch 402. The intermediate-frequency filter 304 performs a frequency selection operation by passing only the component of the intermediate-frequency signal IF in a prescribed frequency band centered on a prescribed frequency, thereby extracting an intermediate-frequency signal IFX without unwanted frequency components. The intermediate-frequency amplifier 305 amplifies the intermediate-frequency signal IFX, and supplies the amplified intermediate-frequency signal to the demodulator 306. The demodulator 306 demodulates the amplified intermediate-frequency signal. During normal operation, the demodulator 306 recovers transmitted information present in the signal received by the wireless antenna.

The gain adjustment memory 401 in the test support circuit 400 stores gain write data GDW1, GDW2 externally input via terminal 107, and generates the gain control signals GC1, GC2. The gain control signals have levels corresponding to respective values in the gain write data. The gain adjustment memory 401 supplies gain control signal GC1 to the low-noise amplifier 301 and gain control signal GC2 to the mixer 302.

Based on a two-bit test mode signal MD1 externally input via terminal 108, the input switch 402 selects the RF signal TS1 externally input via terminal 106, the amplified RF signal R, or the intermediate-frequency signal IF, and supplies the selected signal to the signal strength detector 403. For example, the input switch 402 may select the RF test signal TS1 when test mode signal MD1 has logic value '00', the amplified RF signal R when test mode signal MD1 has logic value '01', and the intermediate-frequency signal IF when test mode signal MD1 has logic value '10', as indicated.

The signal strength detector 403 detects the strength of the signal selected by the input switch 402, and outputs a strength signal SS indicating the detected strength via terminal 109.

The test device 2 includes an RF signal source 40, a control unit 42, a DC voltage sensor 45, a gain adjustment writer 47, and a display 49, and has terminals 43, 46, 48, and 50. The RF signal source 40 generates an RF test signal TS1 having the specified wireless transmission frequency and outputs it via terminal 43. Terminal 43 is connected to terminal 106 of the semiconductor chip 1. The strength signal SS sent from terminal 109 of the semiconductor chip 1 is externally input via terminal 46, its DC voltage is measured by the DC voltage sensor 45, and the measured value is supplied to the control unit 42 in digital form as a strength value TG1. The control unit 42 supplies gain data GD to the gain adjustment writer 47. The gain adjustment writer 47 generates the gain write data GDW1, GDW2, which represent gain adjustment values to be written in the gain adjustment memory 401, and outputs these data GDW1, GDW2 via terminal 48, which is connected to input terminal 107 of the semiconductor chip 1. The control unit 42 also generates the test mode signal MD1 and outputs it to terminal 50, which is connected to terminal 108 of the semiconductor chip 1.

The operations for testing and adjusting the semiconductor chip 1 by the test device 2 in FIG. 7 will now be described.

Figure 8:
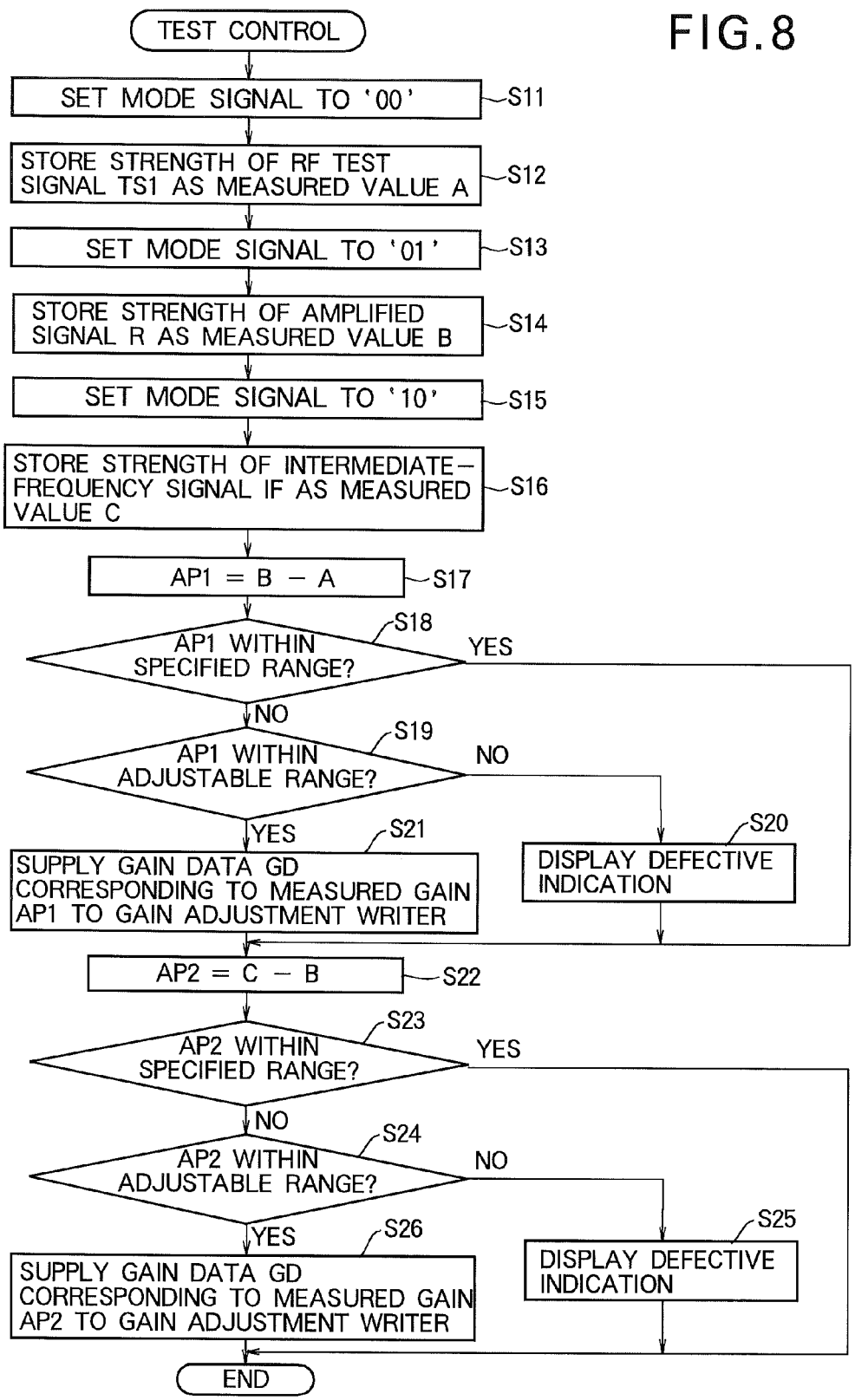
FIG. 8 is a flowchart illustrating an exemplary test control procedure carried out by the control unit in FIG. 7.

The control unit 42 in the test device 2 tests and adjusts the amplification unit consisting of the low-noise amplifier 301 and mixer 302 in the receiving section 300 in the semiconductor chip 1 by following the test control procedure illustrated in FIG. 8.

To start this procedure, the control unit 42 sets the test mode signal MD1 to a logic value of '00' (step S11). Execution of step S11 causes the input switch 402 to supply the RF test signal TS1 received from the RF signal source 40 in the test device 2 to the signal strength detector 403. The signal strength detector 403 detects the strength of the RF test signal TS1 and sends a strength signal SS indicating the detected strength via terminal 109 to terminal 46 of the test device 2. The DC voltage sensor 45 in the test device 2 measures the DC voltage of the strength signal SS and supplies the measured value to the control unit 42 as a strength value TG1.

The control unit 42 receives the strength value TG1 supplied from the DC voltage sensor 45 and stores it as a measured value A in an internal register (not shown) (step S12).

To summarize, in steps S11 and S12, the strength of the RF test signal TS1 sent from the test device 2 to semiconductor chip 1 is detected by the signal strength detector 403 in the semiconductor chip 1. The result is sent back to the test device 2, where it is stored in an internal register as measured value A.

Next, the control unit 42 sets test mode signal MD1 to a logic value of '01' (step S13). Execution of step S13 causes the input switch 402 to route the amplified RF signal R supplied from the low-noise amplifier 301 to the signal strength detector 403. The signal strength detector 403 detects the strength of the amplified RF signal R, and sends a strength signal SS indicating the signal strength via terminals 109 and 46 to the DC voltage sensor 45 in the test device 2. The DC voltage sensor 45 measures the DC voltage of the strength signal SS and outputs a corresponding strength value TG1.

The control unit 42 receives the strength value TG1 from the DC voltage sensor 45 and stores it in an internal register as a measured value B (step S14).

To summarize, in steps S13 and S14, the signal strength detector 403 detects the strength of the amplified RF signal R generated by the low-noise amplifier 301 from the RF test signal TS1, and the result is stored in an internal register in the test device 2 as measured value B.

Next, the control unit 42 sets the test mode signal MD1 to a logic value of '10' (step S15). Execution of step S15 causes the input switch 402 to supply the intermediate-frequency signal IF output from the mixer 302 to the signal strength detector 403. The signal strength detector 403 detects the strength of the intermediate-frequency signal IF and sends a strength signal SS indicating the signal strength via terminals 109 and 46 to the DC voltage sensor 45 in the test device 2. The DC voltage sensor 45 measures the DC voltage of the strength signal SS and outputs a corresponding strength value TG1.

The control unit 22 receives the strength value TG1 from the DC voltage sensor 45 and stores it in another internal register (not shown) as a measured value C (step S16).

To summarize, in steps S15 and S16, the signal strength detector 403 detects the strength of the intermediate-frequency signal IF that the mixer 302 generates by down-conversion of the amplified RF signal R, and the result is stored in an internal register in the test device 2 as measured value C.

Next, the control unit 22 subtracts measured value A from measured value B to obtain the difference in strength between the RF test signal TS1 and the amplified RF signal R output from the low-noise amplifier 301, and stores the result in an internal register as the measured gain value AP1 of the low-noise amplifier 301 (step S17).

Then the control unit 42 decides whether the measured gain value AP1 falls within a specified range (step S18). If the measured gain value AP1 does not fall within the specified range in step S18, the control unit 42 decides whether it falls within an adjustable range (step S19). If the measured gain value AP1 does not fall within the adjustable range in step S19, the control unit 42 causes the display 49 in the test device 2 to display a test result indicating that the semiconductor chip 1 is defective (step S20). If the measured gain value AP1 falls within the adjustable range in step S19, the control unit 42 reads a gain adjustment value corresponding to the measured gain value AP1 from a memory (not shown) in which a gain adjustment value is prestored for each relevant gain value, and supplies gain data GD indicating the gain adjustment value to the gain adjustment writer 47 (step S21). Following step S21, the gain adjustment writer 47 converts the gain adjustment value indicated by the gain data GD to a value to be written in the gain adjustment memory 401 and supplies this value as gain write data GDW1 via terminal 48 to terminal 107 of the semiconductor chip 1. The gain adjustment memory 401 stores the gain write data GDW1 input via terminal 107 and supplies the low-noise amplifier 301 with a corresponding gain control signal GC1. The amplification gain of the low-noise amplifier 301 is adjusted according to this gain control signal GC1.

Following either this gain adjustment or execution of step S20, or following a decision in step S18 that the measured gain value AP1 falls within the specified range, the control unit 42 subtracts measured value B from measured value C to obtain the difference in strength between the amplified RF signal R input to the mixer 302 and the intermediate-frequency signal IF output from the mixer 302, and stores the result in an internal register as a measured gain value AP2 (step S22).

Next, the control unit 42 decides whether this measured gain value AP2 falls within a specified range (step S23). If the measured gain value AP2 does not fall within the specified range in step S23, the control unit 42 decides whether the measured gain value AP2 falls within an adjustable range (step S24). If the measured gain value AP2 does not fall within the adjustable range in step S24, then the control unit 42 causes the display 49 to display a test result indicating that the semiconductor chip 1 is defective (step S25). If the measured gain value AP2 falls within the adjustable range in step S24, the control unit 42 reads a gain adjustment value corresponding to the measured gain value AP2 from a memory (not shown) in which a gain adjustment value is prestored for each relevant gain value, and supplies gain data GD indicating the gain adjustment value to the gain adjustment writer 47 (step S26). Following step S26, the gain adjustment writer 47 converts the gain adjustment value indicated by the gain data GD to the value to be written in the gain adjustment memory 401 and supplies this value as gain write data GDW2 via terminal 48 to terminal 107 of the semiconductor chip 1. The gain adjustment memory 401 stores the gain write data GDW2 and supplies the mixer 302 with a corresponding gain control signal GC2. The amplification gain of the mixer 302 is adjusted according to this gain control signal GC2.

Following either this gain adjustment or execution of step S25, or following a decision in step S23 that the measured gain value AP2 falls within the specified range, the control unit 42 terminates the test and adjustment process shown in FIG. 8.

To summarize, if the measured gain values of the low-noise amplifier 301 and mixer 302 are not within respective specified ranges, they are adjusted, if possible, to values within the specified ranges. If either measured gain value is so far outside the specified range that adjustment is not possible, a message indicating that the semiconductor chip 1 is defective is displayed.

In a variation of the procedure in FIG. 8, step S20 is followed by termination of the procedure instead of by step S22.

In the configuration in FIG. 7, among the functional blocks (301, 302, and 304 to 306) constituting the receiving section in the semiconductor chip 1, the low-noise amplifier 301 and mixer 302 are tested. In order to obtain the measured gain values of the low-noise amplifier 301 and mixer 302, the signal strength detector 403 detects the strength of their input and output signals and sends strength signals SS indicating their signal strengths as DC levels back to the test device 2. On the basis of the strength signals SS output from the semiconductor chip 1, the test device 2 obtains the measured gain values of the low-noise amplifier 301 and mixer 302 and decides whether the measured gain values (AP1 and AP2) fall within respective specified ranges or not, that is, whether the operating characteristics of the low-noise amplifier 301 and mixer 302 fall within specified ranges. In this test, the RF and IF signals generated by the low-noise amplifier 301 and mixer 302 are not sent back to the test device 2, so there is no loss of signal level as would occur if these oscillating signals were to be transmitted from the semiconductor chip 1 to the test device 2 over a signal transmission line.

Therefore, compared with conventional test procedures in which oscillating signals are transferred to the test device and analyzed by an analyzer in the test device to test the operating characteristics of the low-noise amplifier 301 and mixer 302, the configuration shown in FIG. 7 provides a more precise test, because the test is not affected by transmission loss. In addition, the cost of the test is reduced because the test device does not require an expensive analyzer.

More specifically, the semiconductor chip 1 in FIG. 7 uses its on-chip input switch 402 and on-chip signal strength detector 403 to detect the strengths (A) of the RF test signal TS1 supplied to the low-noise amplifier 301, (B) of the amplified RF signal R output from the low-noise amplifier 301, and (C) of the intermediate-frequency signal IF output from the mixer 302. The operating characteristics of the low-noise amplifier 301 and mixer 302 are evaluated by taking differences among the strength values A, B, C. The RF test signal TS1 is supplied from the test device 2 to the low-noise amplifier 301 and input switch 402 over a transmission line interconnecting terminals 43 and 106. Although a transmission loss occurs on this signal transmission line, the loss cancels out when A is subtracted from B, and when B is subtracted from C. The loss is thereby eliminated from the test results, enabling high precision test and adjustment.

Figure 10:
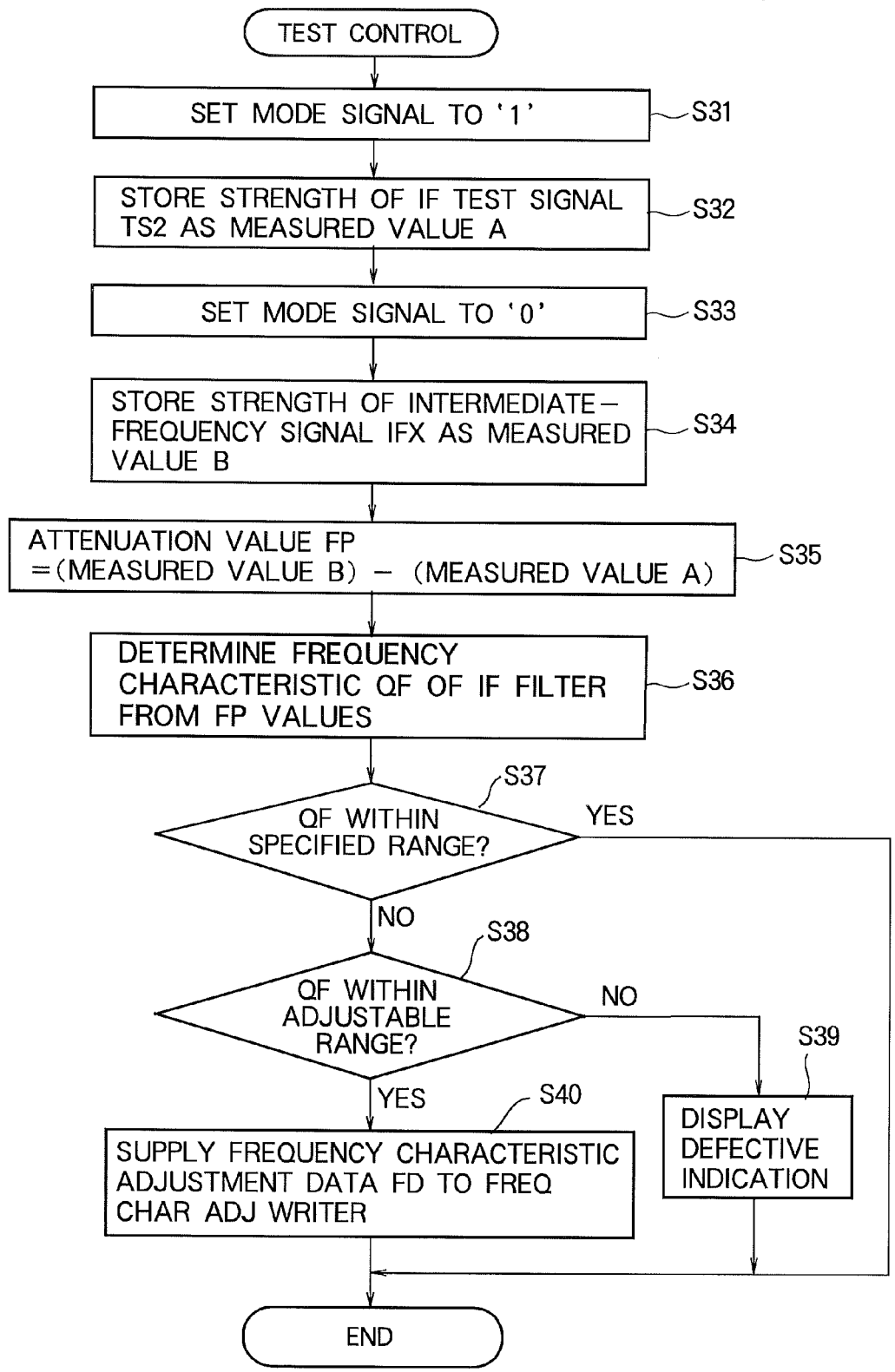
FIG. 10 is a flowchart illustrating an exemplary test control procedure carried out by the control unit in FIG. 9.

The configuration in FIG. 7 tests the low-noise amplifier and mixer, but if necessary, the intermediate-frequency filter may be tested in a similar way, as shown in FIGS. 9 and 10.

The test device 2 in FIG. 9 has generally the same structure as in FIG. 7, but there are differences in the operation of some elements, as indicated by the suffixes (a) added to their reference characters. In particular, the RF signal source 40 becomes an intermediate-frequency (IF) signal source 40a, and the gain adjustment writer 47 becomes a frequency characteristic adjustment writer (FREQ CHAR ADJ WRITER) 47a. The test device also has input and output terminals 51-54 that were not shown in FIG. 7.

The IF signal source 40a in FIG. 9 outputs an IF test signal TS2 with a variable intermediate frequency to terminal 51. During a test, the IF signal source 40a increases the signal frequency in incremental steps: for example, from 1.0 MHz to 1.1 MHz, 1.2 MHz, . . . , 2 MHz.

The DC voltage sensor 45a is connected to terminal 52, which is connected to terminal 109 of the semiconductor chip 1 to receive the strength signal SS. The output of the DC voltage sensor 45a is denoted TG2 to distinguish it from the output of the DC voltage sensor 45 in FIG. 7.

The frequency characteristic adjustment writer 47a outputs frequency characteristic write data FDW to terminal 53. The frequency characteristic write data FDW represent one or more values to be written in the semiconductor chip 1 to adjust the operating characteristics of the intermediate-frequency filter.

The control unit 42 outputs a one-bit signal denoted MD2 to terminal 54.

The semiconductor chip 1 in FIG. 9 has input and output terminals 110-113, input switches 404, 405, and a frequency characteristic adjustment memory (FREQ CHAR ADJ MEM) 406 that were not shown in FIG. 7, and the intermediate-frequency filter 304a in FIG. 9 has interconnections for test and adjustment that were likewise not shown in FIG. 7. The signal strength detector 403 is connected to switch 405 in FIG. 9 instead of switch 402 in FIG. 7. Terminal 111 is connected to terminal 51 of the test device 2 to receive the IF test signal TS2. Terminal 112 is connected to terminal 53 of the test device to receive the frequency characteristic write data FDW.

Input switch 404 is controlled by a test command signal TES externally input via terminal 110 of the semiconductor chip 1, and receives the IF test signal TS2 from terminal 111. When the test command signal TES is at the '1' logic level, input switch 404 supplies the IF test signal TS2 to the intermediate-frequency filter 304a and input switch 405. When the test command signal TES is at the '0' logic level, input switch 404 passes the intermediate-frequency signal IF output by the mixer 302 to the intermediate-frequency filter 304a. The signal output from the intermediate-frequency filter 304a is branched to input switch 405 as well as being input to the intermediate-frequency amplifier 305.

The intermediate-frequency filter 304a generates an intermediate-frequency signal IFX as described above, by selecting a desired frequency component of the input signal supplied by input switch 404. The operating characteristics of the intermediate-frequency filter 304a, such as its center frequency and attenuation characteristic, are adjustable by a frequency characteristic signal GF received from the frequency characteristic adjustment memory 406. The frequency characteristic adjustment memory 406 stores frequency characteristic write data FDW externally input via terminal 112 and sets the frequency characteristic signal GF to a corresponding frequency characteristic adjustment value or values.

When input switch 405 receives a test mode signal MD2 at the '1' logic level, it sends the IF test signal TS2 supplied via input switch 404 to the signal strength detector 403. When input switch 405 receives a test mode signal MD2 at the '0' logic level, it supplies the signal strength detector 403 with the intermediate-frequency signal IFX branched from the intermediate-frequency filter 304a.

The signal strength detector 403 detects the strength of the signal received from input switch 405 and outputs a strength signal SS indicating the detected strength to terminal 109.

The control unit 42 in the test device 2 tests and adjusts the frequency characteristic of the intermediate-frequency filter 304a in the semiconductor chip 1 by following the test control procedure illustrated in FIG. 10. During this procedure, the test command signal TES input at terminal 110 is externally held at the '1' logic level, so the IF test signal TS2 generated by the IF signal source 40a is supplied to the intermediate-frequency filter 304a and input switch 405.

Initially, the control unit 42 sets test mode signal MD2 to the '1' logic level (step S31). Execution of step S31 causes input switch 405 to route the IF test signal TS2 supplied via input switch 404 to the signal strength detector 403. The signal strength detector 403 detects the strength of the IF test signal TS2 and sends a strength signal SS indicating the signal strength via terminals 109 and 52 to the DC voltage sensor 45a in the test device 2. The DC voltage sensor 45a measures the DC voltage of the strength signal SS and outputs the DC voltage value in digital form as a strength value TG2.

The control unit 42 receives the strength value TG2 from the DC voltage sensor 45a and stores it as a measured value A in an internal register (not shown) (step S32).

To summarize, in steps S31 and S32, the strength of the IF test signal TS2 sent from the test device 2 to the semiconductor chip 1 is detected by the signal strength detector 403 in the semiconductor chip 1. The result is sent back to the test device 2, where it is stored in an internal register as measured value A.

Next, the control unit 42 sets test mode signal MD2 to the '0' logic level (step S33). Execution of step S33 causes input switch 405 to supply the intermediate-frequency signal IFX output from the intermediate-frequency filter 304a to the signal strength detector 403. The signal strength detector 403 detects the strength of the intermediate-frequency signal IFX, and sends a strength signal SS indicating the signal strength via terminals 109 and 52 to the DC voltage sensor 45a in the test device 2. The DC voltage sensor 45a measures the DC voltage of the strength signal SS input at terminal 52 and outputs a corresponding strength value TG2.

The control unit 42 receives the strength value TG2 from the DC voltage sensor 45a and stores it in an internal register as a measured value B (step S34).

To summarize, in steps S33 and S34, the signal strength detector 403 detects the strength of the intermediate-frequency signal IFX generated by the intermediate-frequency filter 304a from the IF test signal TS2 and the result is stored in an internal register in the test device 2 as measured value B.

Next, the control unit 22 subtracts measured value A from measured value B to obtain the difference in strength between the IF test signal TS2 supplied to the semiconductor chip 1 and the intermediate-frequency signal IFX output by the intermediate-frequency filter 304a, and stores the result as an attenuation value FP of the intermediate-frequency filter 304a in an internal register (step S35). Steps S1 to S35 are repeated as the IF signal source 40a in the test device 2 increases the frequency of IF test signal TS2 in incremental steps, (e.g., 1.0 MHz, 1.1 MHz, 1.2 MHz, . . . , 2.0 MHz). The control unit 42 obtains an attenuation value FP for each generated frequency of the IF test signal, and stores these values in correspondence to the frequency values in an internal memory (not shown).

From the attenuation values FP stored in association with frequency values in the internal memory, the control unit 42 determines the measured frequency characteristic QF of the intermediate-frequency filter 304a (step S36), and control unit 42 decides whether the measured frequency characteristic QF falls within a specified frequency characteristic range (step S37). If the measured frequency characteristic QF does not fall within the specified frequency characteristic range in step S37, the control unit 42 decides whether the measured frequency characteristic QF falls within an adjustable range (step S38). If the measured frequency characteristic QF does not fall within the adjustable range, the control unit 42 causes the display 49 in the test device 2 to display a test result indicating that the semiconductor chip 1 is defective (step S39).

If the measured frequency characteristic QF does not fall within the adjustable range in step S38, the control unit 42 determines the frequencies at which the measured frequency characteristic QF departs from the specified frequency characteristic range, and supplies the frequency characteristic adjustment writer 47a with frequency characteristic data FD indicating an adjustment value or values that will bring the frequency characteristic within the specified range at these frequencies (step S40). Execution of step S40 causes the gain adjustment writer 47a to supply frequency characteristic write data FDW representing the adjustment value(s) via terminals 53 and 107 to the frequency characteristic adjustment memory 406 in the semiconductor chip 1. The frequency characteristic adjustment memory 406 supplies the intermediate-frequency filter 304a with a frequency characteristic signal GF having a level or levels corresponding to the adjustment value(s) represented by the frequency characteristic write data FDW. The intermediate-frequency filter 304a operates with a frequency characteristic adjusted according to the frequency characteristic signal GF.

Following either this frequency characteristic adjustment or execution of step S39, or following a decision in step S37 that the measured frequency characteristic QF falls within the specified range, the control unit 42 terminates the test and adjustment procedure shown in FIG. 10.

To summarize, if the measured frequency characteristic of the intermediate-frequency filter 304a is not within the specified range, the intermediate-frequency filter 304a is adjusted, if possible, to bring its characteristic within the specified range. If the measured frequency characteristic is too far outside the specified range to be adjusted, a message indicating that the semiconductor chip 1 is defective is displayed.

As described above, when the semiconductor chip 1 in FIG. 9 receives a test command to test the intermediate-frequency filter 304a in its receiving section 300, it switches the input of the intermediate-frequency filter 304a over to an externally supplied IF test signal TS2. The signal strength detector 403 detects the strength of the intermediate-frequency signal IFX output from the intermediate-frequency filter 304a and sends the strength signal SS indicating the signal strength to the test device 2. On the basis of the strength signal SS output from the semiconductor chip 1, the 2 measures the frequency characteristic QF of the intermediate-frequency filter 304a by determining its attenuation values FP at different frequencies, and decides whether the measured frequency characteristic QF falls within a specified range or not.

In this test, the intermediate-frequency signal IFX generated by the intermediate-frequency filter 304a is not transmitted to the test device 2, so there is no loss of signal level as would occur if this oscillating signal were to be sent from the semiconductor chip 1 to the test device 2 over a signal transmission line.

Compared with conventional test procedures in which the filtered intermediate-frequency signal is transferred to the test device and analyzed by an analyzer in the test device, the configuration shown in FIG. 9 enables more precise and less expensive testing of the intermediate-frequency filter 304a, because the test is not affected by transmission line loss and does not require an expensive analyzer.

In the configuration in FIG. 9, the operating characteristic of the intermediate-frequency filter 304a is tested and adjusted on the basis of the difference between the strength of the IF test signal TS2 supplied to the intermediate-frequency filter 304a (measured value A) and the strength of the intermediate-frequency signal IFX generated by the intermediate-frequency filter 304a (measured value B), the strengths of both signals TS2 and IFX being detected by the signal strength detector 403 in the semiconductor chip 1.

The IF test signal TS2 is supplied from the test device 2 to input switch 404 over the signal transmission line interconnecting terminals 51 and 111. Although a loss of signal level occurs on this signal transmission line, the loss cancels out when measured value A is subtracted from measured value B.

The signal strength detection circuits 15 and 403 in the above embodiments are not limited to the source follower configuration and half-wave diode rectifier configuration shown in FIGS. 2 and 3. Other circuit configurations, such as a full-wave rectifier configuration or a multi-phase rectifier configuration, may be used instead.

In the above embodiments, the oscillating test signal (TS, TS1, or TS2) input to the functional block (14 or 304) or blocks (301 and 302) under test and the oscillating signal (TRS or IFX) or signals (R and IF) output from the functional block or blocks under test are selectively supplied through a switch to a single signal strength detector. An alternative configuration provides a separate signal strength detector for each oscillating test signal and each oscillating output signal, and uses an input switch to select the output of the desired signal strength detector.

Figure 11:
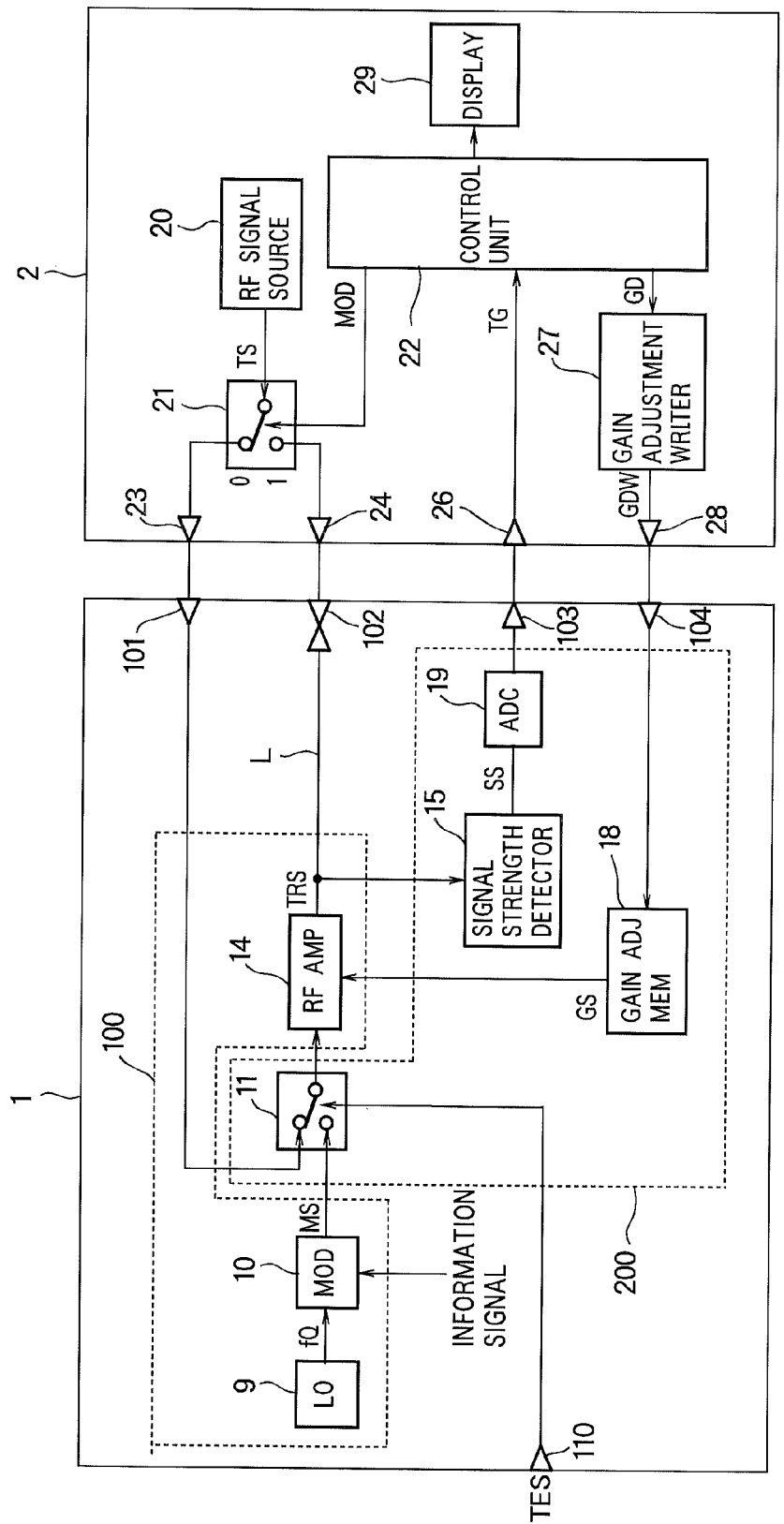
FIG. 11 shows another variation of the structure shown in FIG. 1.

An analog-to-digital converter (ADC) may be provided in the semiconductor chip 1 to convert the strength signal SS output by the signal strength detector to a digital signal for transfer to the test device 2. This digital signal may be supplied directly to the control unit 42 in the test device 2, eliminating the need for a separate DC voltage sensor. FIG. 11 shows an analog-to-digital converter 19 added in this way to the configuration in FIG. 1.

Means for adjusting the detection range of the signal strength detector may also be provided. In FIG. 2, for example, the bias current supplied by the current source VI may be adjustable. In FIG. 3, a variable attenuator may be provided to adjust the level of the input signal. If the attenuation ratio of the attenuator is set as a resistance ratio, attenuation ratios may be tested by a direct-current measurement.

The gain and frequency characteristic adjustment memories 18, 401, 406 may be, for example, electrostatic nonvolatile memory devices, resistive nonvolatile memory devices, fuse-programmable memory devices, or laser-programmable memory devices. If a laser-programmable memory is employed, the adjustment data calculated by the test device 2 are written (burned) into the semiconductor chip 1 by a laser beam, without the need to transfer adjustment data from the test device 2 to the semiconductor chip 1 via the terminals (28, 48, 53, 104, 107, 112) and signal lines or probes shown in the drawings.

Detection of the strength of the output signal of the RF amplifier 14 may require connection of a termination resistor. If so, the test device 2 may include an additional input switch by which the termination resistor is connected when needed and disconnected when not needed. Alternatively, the additional switch for connection of the termination resistor may be included in the semiconductor chip 1.

In the test control procedures shown in FIGS. 4, 8, and 10, decisions on whether the characteristics of the functional blocks under test fall within specified ranges or not is based on values (AP, AP1, AP2, FP) obtained by subtracting a measured value A from a measured value B or a measured value B from a measured value C, but other decision methods may be used. For example, the decision may be based on the ratio of measured value A to measured value B (or of measured value B to measured value C). This ratio may be obtained by dividing one measured value by the other, or by measuring the values on a logarithmic scale and taking the difference between the measured values.

The strength of the oscillating test signal TS, TS1, or TS2 may be variable. The test signal source 20, 40, or 40a may generate a series of oscillating test signals with different signal strengths, and whether the functional block under test passes or fails the test or is within the adjustable range or not may be determined from the results of a series of measurements made with these test signals.

The input switch 11 that selects the input signal to the RF amplifier 14 in FIGS. 1 and 5 may be replaced with an on-off switch that supplies the RF test signal TS to the RF amplifier 14 during tests (during which the modulator 10 is disabled) and is turned off during normal operation.

Those skilled in the art will recognize that further variations are possible within the scope of the invention, which is defined in the appended claims.

What is claimed is:
1. A semiconductor chip comprising:
a functional block for generating an oscillating output signal to perform a communication function;
an input circuit for selectively supplying a first oscillating test signal supplied from a test device to test the functional block during testing of the functional block and a modulated communication signal during normal operation of the semiconductor chip to the functional block, thereby causing the functional block to generate the oscillating output signal;
a first test line through which the first oscillating test signal is supplied from the test device to the input circuit;
a test circuit for detecting a first strength, the first strength being a strength of the oscillating output signal, and generating a strength signal indicating the first strength;

a signal line for electrically connecting the functional block and the test circuit, thereby causing the oscillating output signal to be supplied from the functional block to the test circuit;

a first external terminal for external output of the strength signal;

a second external terminal for external output of the oscillating output signal; and a second test line for receiving a second oscillating test signal supplied from the test device and supplying the received second oscillating test signal to the test circuit without passing the input circuit and the functional block, wherein:

the test circuit detects the first strength of the oscillating output signal supplied via the signal line and outputs the strength signal indicating the detected first strength to the first external terminal during the testing of the functional block, the test circuit detects a second strength, the second strength being a strength of the second oscillating test signal, generates other strength signal indicating the second strength and outputs the other strength signal to the first external terminal, and the functional block outputs the oscillating output signal to the second external terminal during the normal operation of the semiconductor chip.

2. The semiconductor chip of claim 1, wherein the strength signal and the other strength signal are direct-current signals.

3. The semiconductor chip of claim 1, wherein the strength signal and the other strength signal are direct-current voltage signals.

4. The semiconductor chip of claim 1, wherein the strength signal and the other strength signal are digital signals.

5. The semiconductor chip of claim 1, further comprising a third external terminal for external input of the first oscillating test signal.

6. The semiconductor chip of claim 5, wherein:

the first oscillating test signal is input through the third external terminal to the functional block when the test circuit detects the first signal strength; and the second oscillating test signal is input through the second external terminal to the test circuit when the test circuit detects the second signal strength.

7. The semiconductor chip of claim 5, wherein the test circuit receives the first oscillating test signal via the third external terminal.

8. The semiconductor chip of claim 7, further comprising a first switch connected to the functional block, for selectively supplying the test circuit with the first oscillating test signal input to the functional block and the oscillating output signal output from the functional block.

9. The semiconductor chip of claim 1, further comprising:

a fourth external terminal for external input of an adjustment signal; and an adjustment circuit for storing information provided by the adjustment signal and adjusting the functional block according to the stored information.

10. The semiconductor chip of claim 9, wherein the stored information corresponds to a difference between the first strength and the second strength.

11. The semiconductor chip of claim 1, wherein the functional block is a radio-frequency transmitting amplifier.

12. The semiconductor chip of claim 1, wherein the functional block includes at least one of a receiving low-noise amplifier, a mixer, and an intermediate-frequency filter.

13. The semiconductor chip of claim 1, wherein the first oscillating test signal is identical to the second oscillating test signal.

14. A method of testing a semiconductor chip including a functional block that generates an oscillating output signal to perform a communication function and outputs the oscillating output signal from the semiconductor chip during normal operation of the semiconductor chip, the method comprising:

supplying a first oscillating test signal from an input circuit disposed in the semiconductor chip to the functional block, thereby causing the functional block to generate the oscillating output signal, the input circuit supplying the functional block with the first oscillating test signal to test the functional block during the testing of the semiconductor chip and with a modulated communication signal during the normal operation of the semiconductor chip, the first oscillating test signal being supplied from a test device to the input circuit through a first test line disposed in the semiconductor chip;

supplying the oscillating output signal to a test circuit disposed in the semiconductor chip via a signal line disposed in the semiconductor chip, the signal line electrically connecting the functional block and the test circuit, thereby causing the oscillating output signal to be supplied from the functional block to the test circuit;

detecting a first strength, the first strength being a strength of the oscillating output signal, by using the test circuit, the test circuit also generating a strength signal indicating the first strength;

outputting the strength signal from the semiconductor chip to the test device;

supplying a second oscillating test signal supplied from the test device to the test circuit through a second test line disposed in the semiconductor chip without passing the input circuit and the functional block;

detecting a second strength, the second strength being a strength of the second oscillating test signal, by using the test circuit, the test circuit also generating other strength signal indicating the second strength;

outputting the other strength signal from the semiconductor chip to the test device; and evaluating the strength signal and the other strength signal in the test device to decide whether the functional block has an operating characteristic that falls within a specified range.

15. The method of claim 14, wherein evaluating the strength signal and the other strength signal includes taking a difference between the first strength and the second strength.

16. The method of claim 14, further comprising adjusting the operating characteristic of the functional block if the operating characteristic does not fall within the specified range but falls within an adjustable range.

17. The method of claim 16, wherein adjusting the operating characteristic further comprises:

sending an adjustment signal from the test device to the semiconductor chip;

storing information provided by the adjustment signal in the semiconductor chip; and using an adjustment circuit disposed in the semiconductor chip to adjust the functional block according to the stored information.

18. The method of claim 17, wherein the stored information corresponds to a difference between the first strength and the second strength.

19. The method of claim 14, wherein the method is repeated to test mutually identical functional blocks in each of a plurality of semiconductor chips on a semiconductor wafer.

20. The method of claim 14, wherein the first oscillating test signal is identical to the second oscillating test signal.

* * * * *